US011201244B2

(12) United States Patent
de Souza et al.

(10) Patent No.: US 11,201,244 B2
(45) Date of Patent: Dec. 14, 2021

(54) FINFET RESISTIVE SWITCHING DEVICE HAVING INTERSTITIAL CHARGED PARTICLES FOR MEMORY AND COMPUTATIONAL APPLICATIONS

(71) Applicant: International Business Machines Corporation, Armonk, NY (US)

(72) Inventors: Joel P. de Souza, Putnam Valley, NY (US); Babar Khan, Ossining, NY (US); Arvind Kumar, Chappaqua, NY (US); Yun Seog Lee, Seoul (KR); Ning Li, White Plains, NY (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 170 days.

(21) Appl. No.: 16/410,179

(22) Filed: May 13, 2019

(65) Prior Publication Data
US 2020/0365737 A1    Nov. 19, 2020

(51) Int. Cl.
*H01L 29/78* (2006.01)
*H01L 29/207* (2006.01)
(Continued)

(52) U.S. Cl.
CPC .......... *H01L 29/7851* (2013.01); *G11C 11/54* (2013.01); *H01L 29/0847* (2013.01);
(Continued)

(58) Field of Classification Search
CPC . H01L 29/7851; H01L 29/785; H01L 29/207; H01L 29/66795; H01L 29/0847;
(Continued)

(56) References Cited

U.S. PATENT DOCUMENTS

| 5,075,555 A | 12/1991 | Woldseth et al. |
| 9,698,227 B2 | 7/2017 | Ng et al. |

(Continued)

FOREIGN PATENT DOCUMENTS

WO    2018080513 A1    5/2018

OTHER PUBLICATIONS

Fedorov et al., "Theoretical study of the lithium diffusion in the crystalline and amorphous silicon as well as on its surface," Solid State Phenomena 213 (2014): 29-34.
(Continued)

*Primary Examiner* — Hoang-Quan Ho
(74) *Attorney, Agent, or Firm* — Cantor Colburn LLP; Randall Bluestone (57) ABSTRACT

Embodiments of the invention are directed to a resistive switching device (RSD). A non-limiting example of the RSD includes a fin-shaped element formed on a substrate, wherein the fin-shaped element includes a source region, a central channel region, and a drain region. A gate is formed over a top surface and sidewalls of the central channel region. The fin-shaped element is doped with impurities that generate interstitial charged particles configured to move interstitially through a lattice structure of the fin-shaped element under the influence of an electric field applied to the RSD.

14 Claims, 5 Drawing Sheets

(51) Int. Cl.
*H01L 29/66* (2006.01)
*H01L 29/08* (2006.01)
*H01L 29/10* (2006.01)
*H01L 29/167* (2006.01)
*G11C 11/54* (2006.01)

(52) U.S. Cl.
CPC ........ *H01L 29/1037* (2013.01); *H01L 29/167* (2013.01); *H01L 29/207* (2013.01); *H01L 29/66522* (2013.01); *H01L 29/66795* (2013.01); *H01L 29/785* (2013.01); *H01L 29/66545* (2013.01)

(58) Field of Classification Search
CPC ............... H01L 29/1037; H01L 29/167; H01L 29/66522; H01L 29/66545; G11C 11/54; G11C 2213/33; G11C 2213/53; G11C 13/0009; G11C 13/0002; G11C 2213/50; G11C 2213/30
See application file for complete search history.

(56) References Cited

U.S. PATENT DOCUMENTS

| | | |
|---|---|---|
| 9,831,239 B1 | 11/2017 | Shin et al. |
| 9,859,418 B2 | 1/2018 | Meiser et al. |
| 9,899,480 B2 | 2/2018 | Seabaugh et al. |
| 10,020,400 B2 | 7/2018 | Cheng et al. |
| 10,192,161 B1* | 1/2019 | Khan .................... H01L 45/148 |
| 2005/0104096 A1* | 5/2005 | Lee ................... H01L 29/66795 257/288 |
| 2011/0248322 A1 | 10/2011 | Wong et al. |

OTHER PUBLICATIONS

Goulding, Fred S., "Semiconductor Detectors for Nuclear Spectrometry," University of California, UCRL 16231, 1965, 178 pages.

* cited by examiner

FINFET RESISTIVE SWITCHING DEVICE HAVING INTERSTITIAL CHARGED PARTICLES FOR MEMORY AND COMPUTATIONAL APPLICATIONS

BACKGROUND

The present invention relates in general to fabrication methodologies and resulting structures for semiconductor devices. More specifically, the present invention relates to a fin-type field effect transistor (FinFET) configured and arranged to function as a resistive switching device (RSD) having charged particles that move interstitially through the lattice structure of the FinFET in response to an applied field, thereby enabling the resulting FinFET-RSD to be incorporated in non-volatile memory applications and/or computational applications (e.g., neuromorphic systems).

Resistive random access memory (RRAM) is a nano-scale non-volatile memory (NVM). RRAM provides high density, low power, large endurance, fast write/read/erase speeds, and excellent scalability. A known RRAM storage cell component is two-terminal RSD that can be formed as a metal-insulator-metal (MIM) structure. When a sufficient electrical field or signal is applied across the metal electrodes of a MIM, the resistance of the insulator can be switched from one resistance state to another through various mechanisms. The insulator retains its resistance state until an appropriate electrical signal is applied across the MIM metal electrodes to change it.

RSDs can be implemented in an addressable crossbar array, which is compatible with a variety of electronic circuits and devices, including ultra-high density NVM and neuromorphic computing applications such as artificial neural network (ANN) architectures. In neuromorphic computing applications, the RSD can be used as a connection (synapse) between a pre-neuron and a post-neuron, thus representing the connection weight in the form of device resistance.

The fabrication operations (e.g., CMOS techniques) for forming integrated circuits (ICs) are well developed, and a basic IC component is the metal oxide semiconductor field effect transistor (MOSFET). Because IC fabrication operations are well-developed, designing circuits and circuit components that are compatible with IC fabrication techniques and known IC components is generally desirable. In recent years with the continued push for reductions in IC component size, research has been devoted to the development of non-planar MOSFET architectures such as the FinFET device architecture. In a known FinFET architecture, the main body is a fin-shaped structure in which the source, drain, and channel regions are formed. A gate runs along sidewalls and a top surface of a central portion of the fin, and the central portion of the fin functions as the FinFET channel. The end portions of the fin, which are not under the gate, function as the source region and drain region of the FinFET, respectively. FinFET architectures have been successfully mass manufactured on bulk wafers and silicon-on-insulator (SOI) wafers.

SUMMARY

Embodiments of the invention are directed to a resistive switching device (RSD). A non-limiting example of the RSD includes a fin-shaped element formed on a substrate, wherein the fin-shaped element includes a source region, a central channel region, and a drain region. A gate is formed over a top surface and sidewalls of the central channel region. The fin-shaped element is doped with impurities that generate interstitial charged particles configured to move interstitially through a lattice structure of the fin-shaped element under the influence of an electric field applied to the RSD.

Embodiments of the invention are directed to a method of forming a RSD. A non-limiting example of the method includes forming a fin-shaped element on a substrate, wherein the fin-shaped element includes a source region, a central channel region, and a drain region. A gate is formed over a top surface and sidewalls of the central channel region. The fin-shaped element is doped with impurities that generate interstitial charged particles configured to move interstitially through a lattice structure of the fin-shaped element under the influence of an electric field applied to the RSD.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

In the accompanying figures and following detailed description of the embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although this description includes a detailed description of the formation and resulting structures for a specific type of IC device architecture (i.e., a FinFET), implementation of the teachings recited herein are not limited to a particular type of IC architecture. Rather, embodiments of the present invention are capable of being implemented in conjunction with any other type of IC architecture, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Similarly, various aspects of computing systems and specific computer programs to implement the technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the present invention, with the growth of digital data applications, there is a need for increasingly fast and scalable memory technologies for data storage and data-driven computation. RRAM is a high speed, high density, and low fabrication-cost NVM technology. Thus, RRAM has the potential to replace and/or complement the limited scaling of flash memories and other silicon-based memories such as dynamic random access memory (DRAM) and static random access memory (SRAM).

An RRAM storage cell can be implemented as a RSD having a resistive memory element. When a sufficient electrical field or signal is applied across the RSD resistive memory element, the resistance of the memory element can be switched from one resistance state to another through various mechanisms. The resistive memory element retains its resistance state until an appropriate electrical signal is applied across the RSD to change it.

As previously noted herein, RSDs can be implemented in an addressable crossbar array, which is compatible with a variety of electronic circuits and devices, including ultrahigh density NVM and neuromorphic computing applications such as artificial neural network (ANN) architectures. In neuromorphic computing applications, the RSD can be used as a connection (synapse) between a pre-neuron and a post-neuron, thus representing the connection weight in the form of device resistance.

Turning now to an overview of aspects of the invention, embodiments of the invention provide a FinFET device architecture configured and arranged to function as an FET and as an RSD. Accordingly, the FinFET architecture described herein is referred to as a FinFET-RSD. In accordance with aspects of the invention, the FinFET-RSD includes interstitial charged particles that are capable of moving interstitially through the lattice structure of the FinFET in response to an applied field, thereby enabling the FinFET-RSD to be implemented in non-volatile single-state or multi-state memory applications, as well as in computational applications such as weighted neuromorphic ANNs. In accordance with aspects of the invention, the FinFET-RSDs described herein are compatible with CMOS FinFET fabrication technology. The FinFET-RSD provides technical benefits and effects in that the fin portion of the FinFET-RSD is fully depleted, and the electric fields generated by the FinFET-RSD will be in substantially lateral directions along the fin length. The lateral electric fields allow the FinFET-RSD to minimize particle loss and closely control of the motion of the interstitial charged particles by directing the charged particles laterally through the fin.

In embodiments of the invention, the FinFET-RSD includes a fin-shaped element formed on a substrate, wherein the fin-shaped element includes a source region, a central channel region, and a drain region. A gate is formed over a top surface and sidewalls of the central channel region, and the fin-shaped element is doped with impurities that generate interstitial charged particles configured to move interstitially through a lattice structure of the fin-shaped element under the influence of an electric field being applied to the Fin-FET-RSD. In accordance with aspects of the invention, suitable impurities include but are not limited to lithium, sodium and potassium, all of which can generate interstitial charged particles that will move interstitially through a lattice structure of a semiconductor material (e.g., Si, SiGe, Ga, GaAs, and the like) under the influence of an applied electric field. In embodiments of the invention, the impurities that generate interstitial charged particles can be dopant atoms inserted into the fin through a variety of known doping techniques including, for example, diffusion, ion implantation, in-situ doping, and the like.

In embodiments of the invention, the FinFET-RSD functions as both an FET and as an RSD. For example, the FinFET-RSD is configured to operate as an FET in that, based at least in part on a threshold voltage of the FinFET-RSD being applied to the gate, a current-flow is generated from the source region through the channel region to the drain region of the FinFET-RSD. The FinFET-RSD is configured to operate as an RSD in that interstitially moving the interstitial charged particles through the lattice structure of the fin-shaped element under the influence of an applied electric field results in the threshold voltage of the FinFET-RSD changing, and the threshold voltage of the FinFET-RSD changing results in a resistance of the FinFET-RSD changing. A state of the FinFET-RSD is defined by the resistance of the FinFET-RSD. Thus, the FinFET-RSD changes its state based at least in part on an application of the electric field to the FinFET-RSD, and the Fin-FET-RSD maintains its state based at least in part on the electric field not being applied to the FinFET-RSD.

In embodiments of the invention, the applied electric field that moves the interstitial charged particles in the source and drain regions interstitially into and out of the fin channel is generated by applying a bias between the gate and the drain (or between the gate and the source) of the FinFET-RSD. The interstitial movement of interstitial charged particles stops when the gate-drain (or gate-source) bias is removed, which sets the "state" of the FinFET-RSD. The "state" of the FinFET-RSD can be read by applying a lower gate voltage and measuring the source to drain current (or the resistance). In aspects of the invention, the interstitial charged particles are confined to the fin channel by a gate dielectric that encapsulates the channel region of the fin. In aspects of the invention, the interstitial charged particles are further confined to the fin because the electric field generated by the gate-drain (or gate-source) bias is substantially laterally directed along the long fin direction, which means that the interstitial charged particles will also move substantially laterally along the long fin direction. In embodiments of the invention where the substrate is a semiconductor-on-insulator (SOI) material, the interstitial charged particles are further confined to the fin in that an insulator region of the SOI material functions as a barrier to substantially prevent the interstitial charged particles from leaving the fin-shaped element.

In some aspects of the invention, the FinFET-RSD can be communicatively coupled to an artificial neuron control system that is configured to apply the electric field to the FinFET-RSD to control the state of the FinFET-RSD. Thus, the FinFET-RSD can function as an artificial neuron, and the state of the FinFET-RSD can function as a weight of the artificial neuron.

In some aspects of the invention, the FinFET-RSD can be communicatively coupled to a processor system that applies the electric field to the FinFET-RSD to control the state of the FinFET-RSD. Thus, the FinFET-RSD can function as a non-volatile RRAM storage cell, and the state of the FinFET-RSD can function as stored data of the RRAM storage cell.

In aspects of the invention, the FinFET-RSD can be fabricated using known CMOS fabrication techniques. For example, the fins can be patterned and etched onto a bulk semiconductor substrate or formed on an SOI substrate. The source and drain of the FinFET-RSD can be formed by inserting n-type or p-type dopants into the portion of the fin that will form the source and drain regions. In some embodiment of the invention, the source and drain regions of the fin can be formed by epitaxially growing in-situ doped n-type or p-type raised source/drain regions on the portions of the fin that are not covered by the gate. The impurities that generate the interstitial charged particles can be inserted into the fin after the source and drain regions have been formed, or the impurities that generate the interstitial charged particles can be inserted into the fin during the epitaxial growth process that forms the raised source/drain regions using in-situ doping techniques. In some embodiment of the invention, the impurities that generate the interstitial charged particles are inserted into the source and/or drain regions but are not inserted into the channel region. In some embodiments of the invention, the impurities that generate the interstitial charged particles are inserted into the source, drain, and channel regions. In either scenario, an applied field sets the "state" of the FinFET-RSD by moving interstitial charged particles interstitially into and out of the channel.

Figure 1:
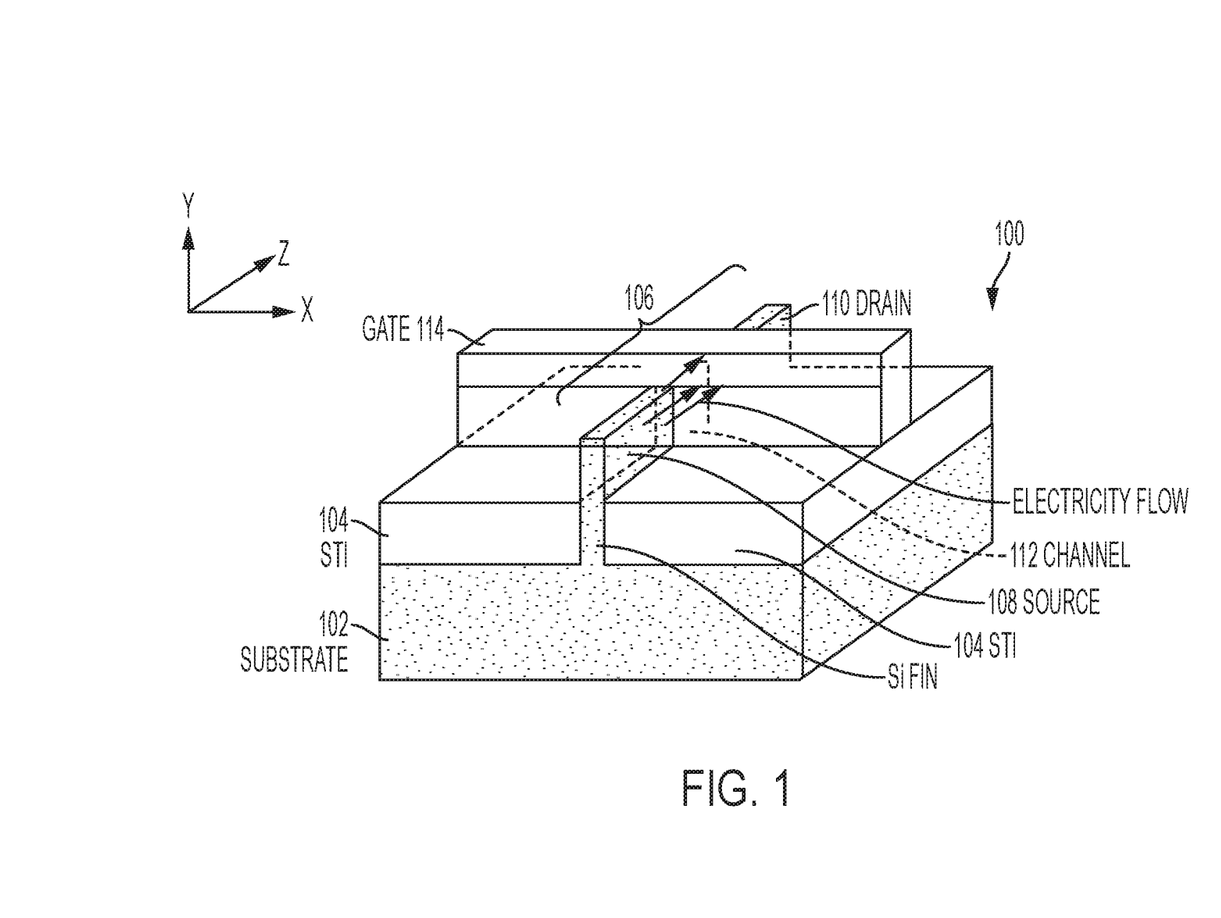
FIG. 1 depicts a three-dimensional view of an example configuration of a FinFET device capable of implementing embodiments of the invention.

Turning now to a more detailed description of aspects of the present invention, FIG. 1 depicts a three-dimensional view of an example configuration of a FinFET device 100 capable of implementing embodiments of the invention. The basic electrical layout and mode of operation of FinFET 100 do not differ significantly from a traditional FET. FinFET 100 includes a semiconductor substrate 102, an STI layer 104, a fin 106 and a gate 114, configured and arranged as shown. Fin 106 includes a source region 108, a drain region 110 and a channel region 112, wherein gate 114 extends over the top and sides of channel region 112. For ease of illustration, a single fin is shown in FIG. 1. In practice, FinFET devices are fabricated having multiple fins formed on STI 104 and substrate 102. Substrate 102 can be silicon, STI 104 can be an oxide (e.g., silicon oxide), and fin 106 can be silicon that has been enriched with dopants to form the source and drain regions 108, 110. Gate 114 controls the source to drain current flow (labeled ELECTRICITY FLOW in FIG. 1). In embodiments of the invention, the substrate 102 can be in an SOI configuration.

The STI regions 104 can be fabricated by depositing a local oxide (e.g., $SiO_2$) between the fins 106 and over the substrate 102. The local oxide is polished and recessed back to form the STI regions 104, and to expose upper portions of the fins 106.

In contrast to planar MOSFETs, the source 108, drain 110 and channel 112 regions are built as a three-dimensional bar on top of the STI layer 104 and the semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The dimensions of the fin establish the effective channel length for the transistor.

In some FinFET architectures, raised source/drain (S/D) regions (not shown in FIG. 1) can be epitaxially grown over the S/D portions 108, 110 of the fin 106 to increase the S/D volume and provide a larger surface for interfacing S/D conductive contacts (not shown in FIG. 1). The S/D contacts are formed on either side of the gate structure 114, which includes a conductive gate material (e.g., tungsten (W), aluminum (Al), and the like) bound at its lower portion by a dielectric liner (e.g., gate dielectric 113 shown in FIG. 3).

Figure 2A:
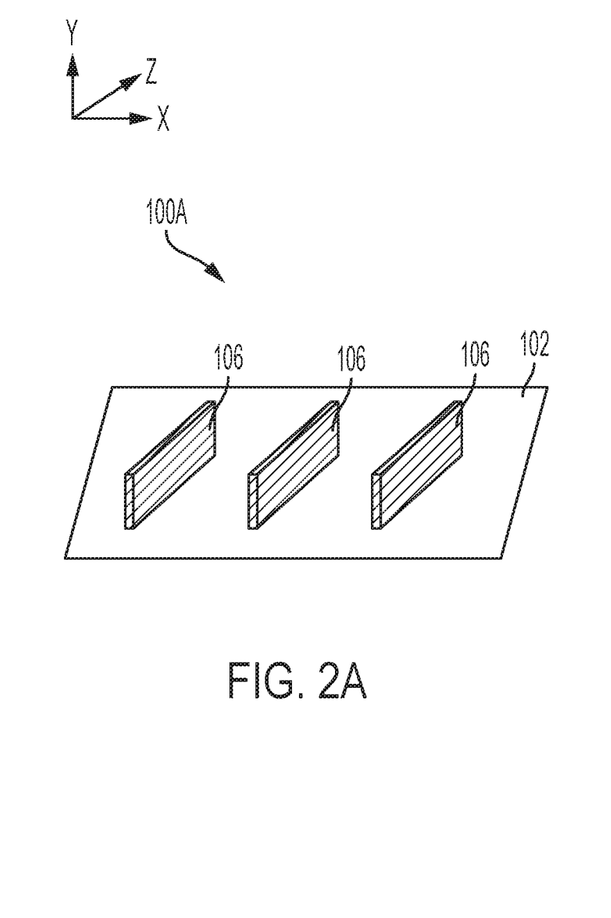
FIG. 2A depicts a three-dimensional view of a representative section of an IC after fabrication operations according to embodiments of the invention.
Figure 2B:
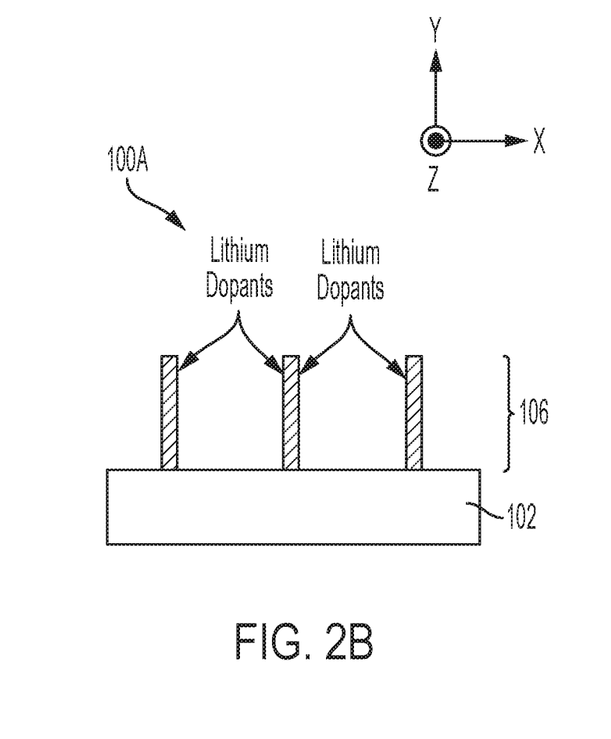
FIG. 2B depicts a cross-sectional view of the representative section of the IC after fabrication operations according to embodiments of the invention.

FIG. 2A depicts a three-dimensional view of a representative section of an IC after fabrication operations according to embodiments of the invention. FIG. 2B depicts a cross-sectional view of the representative section of the IC shown in FIG. 2A after fabrication operations according to embodiments of the invention. FIGS. 2A and 2B depict a semiconductor structure 100A that is a precursor to the FinFET device 100 shown in FIG. 1. The fins 106 can be formed by providing a hard mask layer (not shown) and a patterned resist (not shown) over the substrate 102 to pattern and form the fins 106 from the substrate 102. The fins 106 can be formed by applying an anisotropic etch process, which results in the fin-shaped structures 106.

The source 108 (shown in FIGS. 1 and 3) and the drain 110 (shown in FIGS. 1 and 4) of the fin 106 can be formed by inserting n-type or p-type dopants into the source and drain regions 108, 110. In some embodiment of the invention, the source and drain regions 108, 110 of the fin 106 can be formed by epitaxially growing in-situ doped n-type or p-type raised source/drain regions (not shown) on the portions of the fin 106 that are not covered by the gate 114 (shown in FIGS. 1 and 3). The impurities that generate the interstitial charged particles can be inserted into the fin 106 after the source and drain regions 108, 110 have been formed, or the impurities that generate the interstitial charged particles can be inserted into the fin 106 during the epitaxial growth process that forms the raised source/drain regions using in-situ doping techniques. In some embodiment of the invention, the impurities that generate the interstitial charged particles are inserted into the source and/or drain regions 108, 110 but are not inserted into the channel region 112. In some embodiments of the invention, the impurities that generate the interstitial charged particles are inserted into the source, drain, and channel regions 108, 110, 112.

Figure 3:
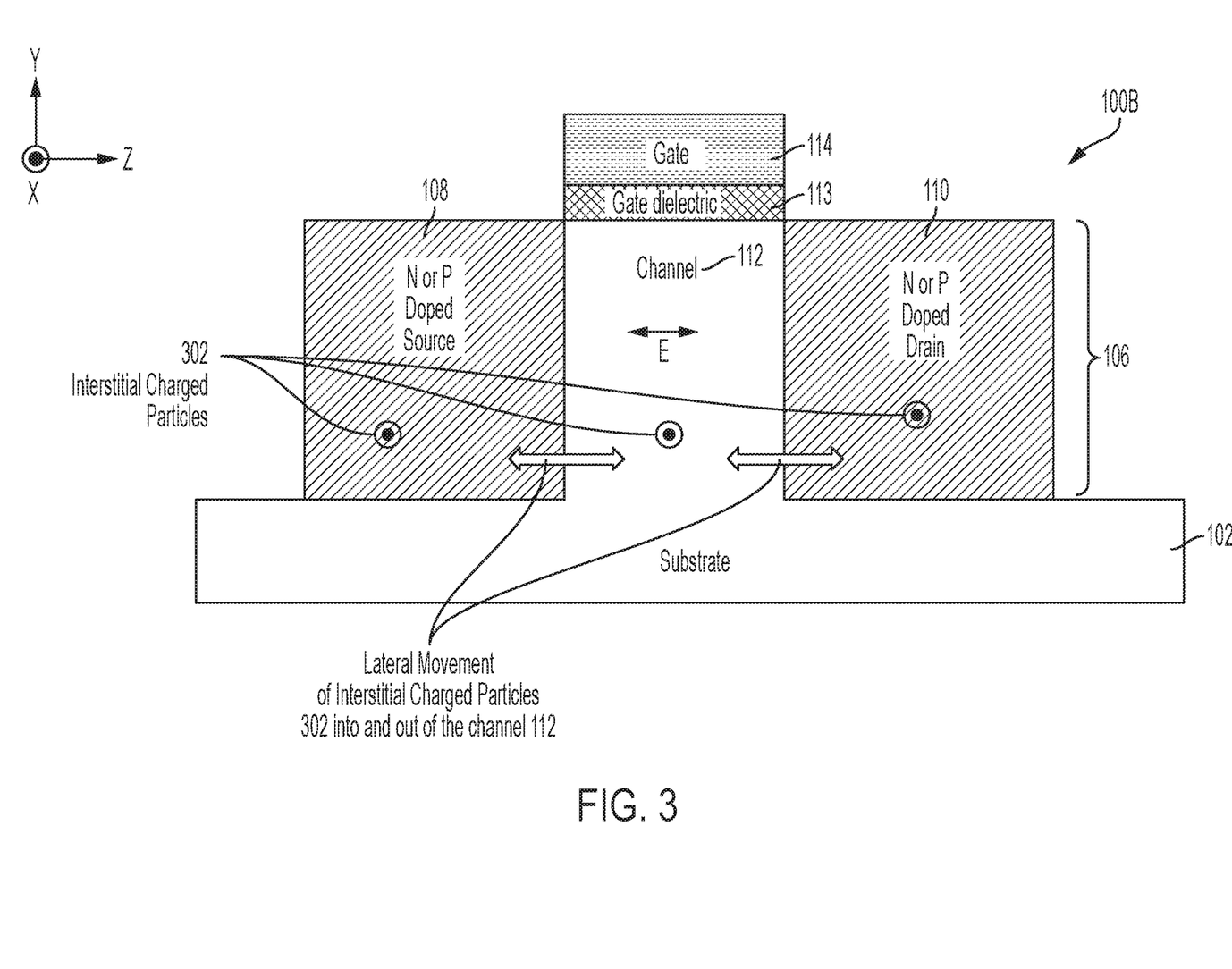
FIG. 3 depicts a cross-sectional view of the representative section of the IC after fabrication operations according to embodiments of the invention.

FIG. 3 depicts a cross-sectional view of a FinFET-RSD 100B after additional fabrication operations have been applied to the semiconductor structure 100A (shown in FIGS. 2A and 2B) to form the FinFET-RSD 100B in accordance with aspects of the invention. The FinFET-RSD 100B is substantially identical to the FinFET 100 (shown in FIG. 1) except FinFET-RSD 100B depicts additional details of a FinFET-RSD fabricated in accordance with aspects of the invention. As shown in FIG. 3, the FinFET-RSD 100B includes the substrate 102, the fin 106, a gate dielectric 113 and a gate 114, configured and arranged as shown. The fin 106 includes the source region 108, the drain region 110, and the channel region 112. The channel regions 112 can be lightly doped or undoped. The source region 108 and the drain region 110 can be doped with p-type dopants (e.g., boron) to form the necessary junctions for p-type transistors. Alternatively, the source region 108 and the drain region 110 can be doped with n-type dopants (e.g., phosphorous) to form the necessary junctions for n-type transistors. In embodiments of the invention, the source and drain regions 108, 110 can be doped using any suitable process, including, for example, diffusion, ion implantation, in-situ doping during epitaxial growth, and the like. In-situ doping can be applied during an epitaxial growth process used to form raised source and drain regions (not shown). Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. In general, n-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

FIG. 3 also depicts interstitial charged particles 302, along with bi-directional arrows that indicate the lateral movement of the interstitial charged particles 302 through a lattice structure of the fin 106 under the influence of an applied electric field (E). In some embodiments of the invention, the interstitial charged particles 302 can be in the source and drain regions 108, 110 but not in the channel region 112. In some embodiments of the invention, the interstitial charged particles 302 can be in the source region 108, the drain region 110, and the channel region 112.

In accordance with aspects of the invention, the interstitial charged particles 302 are configured to move interstitially through a lattice structure of the fin 106 under the influence of an electric field (E) being applied laterally to the FinFET-RSD 100B. The FinFET-RSD 100B functions as both an FET and as an RSD. For example, the FinFET-RSD 100B is configured to operate as an FET in that, based at least in part on a threshold voltage of the FinFET-RSD 100B being applied to the gate 114, a current-flow is generated from the source region 108 through the channel region 112 to the drain region 110. The FinFET-RSD 100B is configured to operate as an RSD in that interstitially moving the interstitial charged particles 302 through the lattice structure of the fin 106 under the influence of an applied electric field (E) results in the threshold voltage of the FinFET-RSD 100B changing, and the threshold voltage of the FinFET-RSD 100B changing results in a resistance of the FinFET-RSD 100B changing. A state of the FinFET-RSD 100B is defined by the resistance of the FinFET-RSD 100B. Thus, the Fin-FET-RSD 100B changes its state based at least in part on an application of the electric field (E) to the FinFET-RSD 100B, and the Fin-FET-RSD 100B maintains its state based at least in part on the electric field (E) not being applied to the FinFET-RSD 100B.

In embodiments of the invention, the applied electric field (E) that moves the interstitial charged particles 302 in the source and drain regions 108, 110 interstitially into and out of the fin channel 112 is generated by applying a bias between the gate 114 and the drain 110 (or between the gate 114 and the source 108). The interstitial movement of interstitial charged particles 302 stops when the gate-drain (or gate-source) bias is removed, which sets the "state" of the FinFET-RSD 100B. The "state" of the FinFET-RSD 100B can be read by applying a lower voltage (e.g., less than about 0.1V) and measuring the source to drain current (or the resistance). In aspects of the invention, the interstitial charged particles 302 are confined to the fin channel by a gate dielectric 113 that encapsulates the channel region 112 of the fin 106. In aspects of the invention, the interstitial charged particles 302 are further confined to the fin 106 because the electric field (E) generated by the gate-drain (or gate-source) bias is substantially laterally directed along the long fin direction, which means that the interstitial charged particles 302 will also move substantially laterally along the long fin direction (shown by the bi-directional arrows shown in FIG. 3). In embodiments of the invention where the substrate is a semiconductor-on-insulator (SOI) material, the interstitial charged particles 302 are further confined to the fin 106 in that an insulator region of the SOI material functions as an additional barrier to substantially prevent the interstitial charged particles 302 from passing through the insulator region and leaving the fin 106.

In embodiments of the invention, the level of impurities that must be inserted into the fin 106 to generate sufficient interstitial charged particles 302 to enable the FinFET-RSD 100B to function as a single-state or multi-state RSD is dependent on a variety of design factors, including the dimension of the fin 106, the gate-to-drain bias, the gate-to-source bias, temperature and the like. In general, a suitable range of impurity concentration in the fin 106 in accordance with aspects of the invention can be from about $1E17cm^3$ to about $1E19cm^3$.

The gate 114 can be formed over the channel region 112 of the fins 106. In aspects of the invention, the gate 114 can be implemented as a high-k metal gate (HKMG), which can be fabricated according to a known replacement metal gate (RMG) processes, wherein a dummy gate (not shown) and sidewall spacers (not shown) are formed during early fabrication operations then replaced with the gate 114 and the dielectric layers 113. The HKMG includes the gate 114 and the gate dielectric layers 113. In general, the gate dielectric layers 113 can include any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric can further include dopants such as lanthanum, aluminum, magnesium.

The gate 114 can include any suitable gate conductive material. The conductive material can further include dopants that are incorporated during or after deposition. In some embodiments of the invention, the gate 114 can further include a work-function setting layer between the gate dielectric 113 and the gate 114. The work-function setting layer can be a work-function metal (WFM) formed from any suitable material. In some embodiments of the invention, a conductive material or a combination of multiple conductive materials can serve as both the main conductive element of the gate 114 and the WFM of the gate 114.

Figure 4:
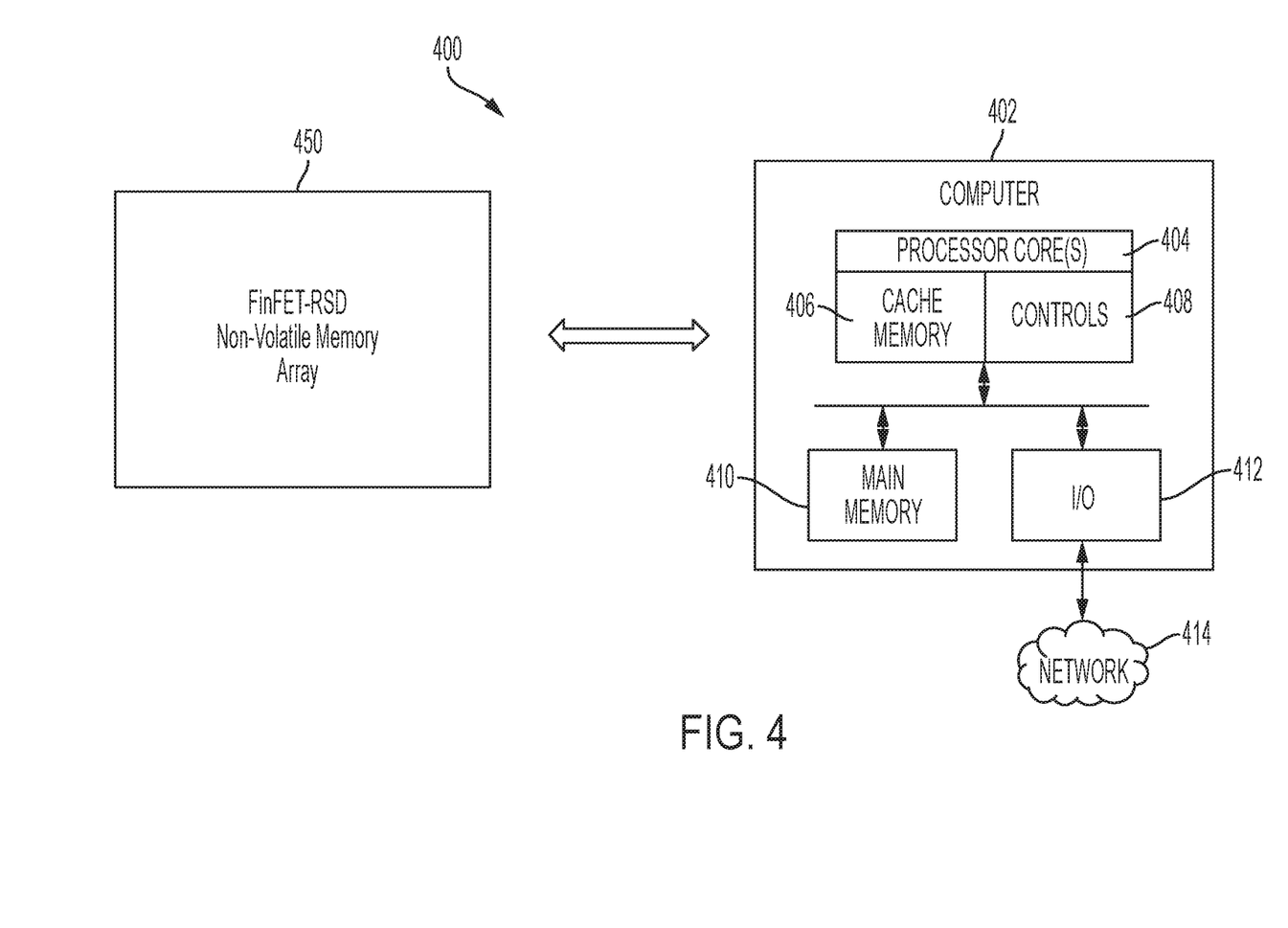
FIG. 4 depicts a diagram illustrating a computer system having FinFET-RSDs in accordance with embodiments of the invention, wherein the FinFET RSDs function as non-volatile single-state or multi-state memory.

FIG. 4 depicts a diagram illustrating a computer system 400 having an addressable array 450 communicatively coupled to a computer system 402. In embodiments of the invention, the addressable array 450 is formed from a plurality of the FinFET-RSDs 100B (shown in FIG. 3). In the array 450, the FinFET RSDs 100B function as non-volatile single-state or multi-state resistive memory cells. In aspects of the invention, the processor system 402 is configured and arranged to apply an electric field (E) to the FinFET-RSD 100B to control the state of the FinFET-RSD 100B. Thus, the FinFET-RSD 100B of the addressable array 450 functions as a non-volatile RRAM storage cell, and the state of the FinFET-RSD 100B functions as stored data of the RRAM storage cell.

The computer system 400 includes an exemplary computing device ("computer") 402 configured to address the array 450, write data to a selected FinFET-RSD 100B of the array 450, and read data from a selected FinFET-RSD 100B of the array 450 in accordance with aspects of the invention. In addition to computer 402, exemplary computer system 400 includes network 414, which connects computer 402 to additional systems (not depicted) and can include one or more wide area networks (WANs) and/or local area networks (LANs) such as the Internet, intranet(s), and/or wireless communication network(s). Computer 402 and additional system are in communication via network 414, e.g., to communicate data between them.

Exemplary computer 402 includes processor cores 404, main memory ("memory") 410, and input/output component(s) 412, which are in communication via bus 403. Processor cores 404 include cache memory ("cache") 406 and controls 408. Cache 406 can include multiple cache levels (not depicted) that are on or off-chip from processor 404. Memory 410 can include various data stored therein, e.g., instructions, software, routines, etc., which, e.g., can be transferred to/from cache 406 by controls 408 for execution by processor 404. Input/output component(s) 412 can include one or more components that facilitate local and/or remote input/output operations to/from computer 402, such as a display, keyboard, modem, network adapter, etc. (not depicted).

Figure 5:
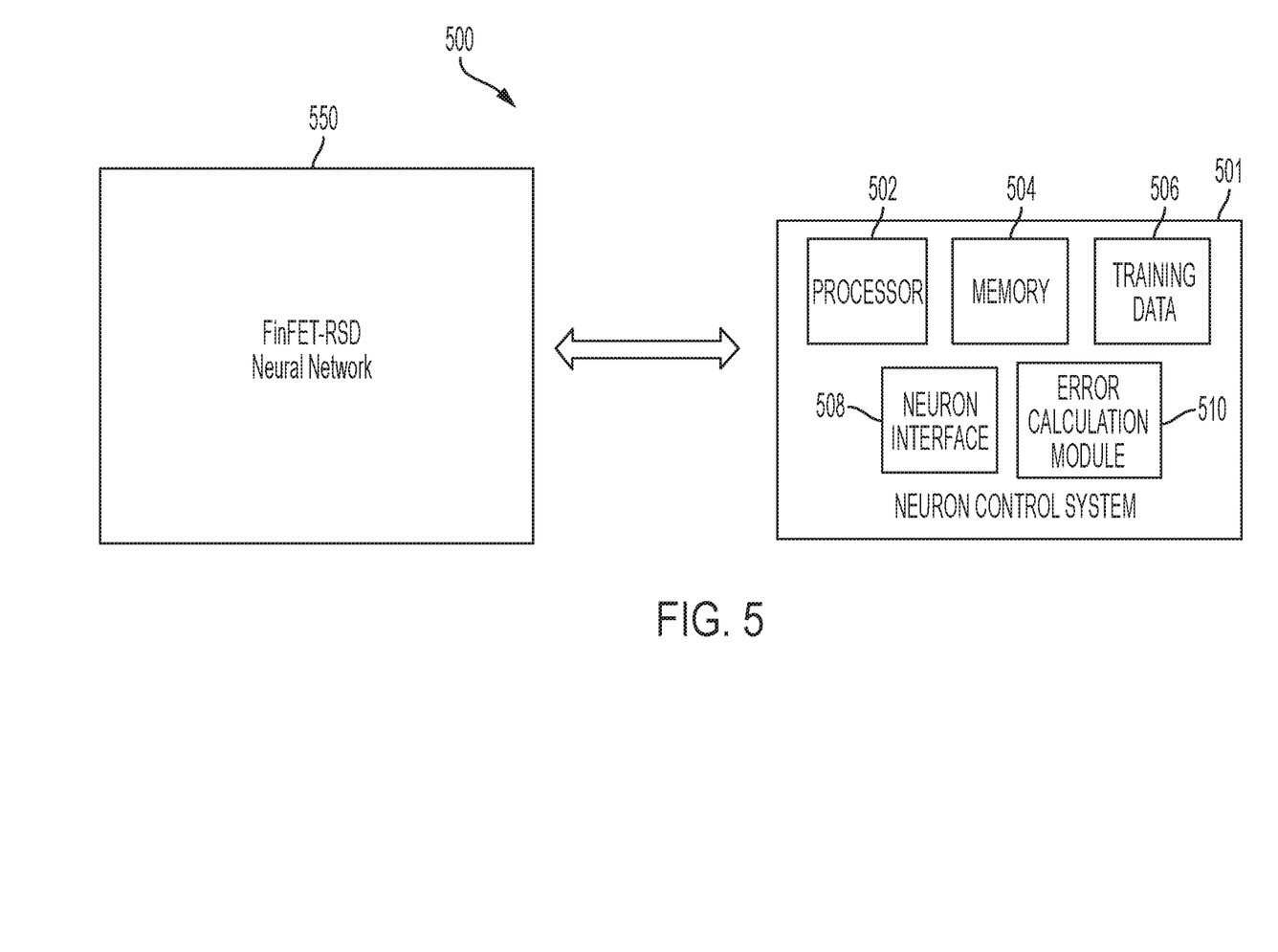
FIG. 5 depicts a diagram illustrating a neural network computer system having FinFET-RSDs in accordance with embodiments of the invention, wherein the FinFET RSDs function as artificial neurons in an ANN.

FIG. 5 depicts a diagram illustrating a neural network computer system 500 that includes a neural network 550 communicatively coupled to an artificial neuron control system 501 in accordance with embodiments of the invention. The neural network 550 includes a plurality of the FinFET RSDs 100B (shown in FIG. 3) configured to function as artificial neurons of the neural network 550. The artificial neuron control system 501 is configured to apply the electric field (E) to the FinFET-RSD 100B to control the state of the FinFET-RSD 100B. Thus, the FinFET-RSD 100B functions as an artificial neuron of the neural network 450, and the state of the FinFET-RSD 100B functions as a weight of the artificial neuron of the neural network 550.

In the neural network 550, the FinFET-RSD 100B can be used as a connection (synapse) between a pre-neuron and a post-neuron, thus representing the connection weight in the form of device resistance. Neuromorphic systems are interconnected processor elements that act as simulated "neurons" and exchange "messages" between each other in the form of electronic signals. Similar to the so-called "plasticity" of synaptic neurotransmitter connections that carry messages between biological neurons, the connections in neuromorphic systems such as neural networks carry electronic messages between simulated neurons, which are provided with numeric weights that correspond to the strength or weakness of a given connection. The weights can be adjusted and tuned based on experience, making neuromorphic systems adaptive to inputs and capable of learning. For example, if the neural network 550 is configured for handwriting recognition, the initial handwriting recognition operation is defined by a set of input neurons, which can be activated by the pixels of an input image. After being weighted and transformed by a function determined by the network's designer, the activations of these input neurons are then passed to other downstream neurons, which are often referred to as "hidden" neurons. This process is repeated until an output neuron is activated. The activated output neuron determines which character was read. Multiple pre-neurons and post-neurons can be connected through an array of FinFET-RSDs 100B, which naturally expresses the fully-connected neural network 550.

The neuron control system 501 includes a hardware processor 502 and memory 504. Training data 506 for the neural network 550 is stored in the memory 506 and is used to train weights of the FinFET-RSDs 100B (shown in FIG. 3) of the neural network 550. A neuron interface 508 controls the FinFET-RSDs 100B of the neural network 550, determining whether the FinFET-RSDs 100B of the neural network 550 are in feed forward mode, back propagation mode, or weight update mode. The neuron interface 508 furthermore provides inputs to the input FinFET-RSDs 100B of the neural network 550 and receives output from the output FinFET-RSDs 100B of the neural network 550. An error calculation module 510 compares the outputs from the FinFET-RSDs 100B of the neural network 550 to training data 506 to determine an error signal. Neuron interface 508 applies the error signal to the output FinFET-RSDs 100B of the neural network 550 during a back propagation mode and subsequently triggers a weight update mode to train the weights of the FinFET-RSDs 100B of the neural network 550 accordingly.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

It will be understood that those skilled in the art, both now and in the future, may make various improvements and enhancements which fall within the scope of the claims which follow.

What is claimed is:

1. An apparatus comprising:
   an addressable non-volatile memory (NVM) array comprising a plurality of addressable resistive random-access memory (RRAM) storage cells;
   wherein each addressable RRAM storage cell of the plurality of RRAM storage cells comprises an addressable resistive switching device (RSD) comprising:
      a fin-shaped element formed on a substrate, wherein the fin-shaped element comprises a source region, a central channel region, and a drain region; and
      a gate formed over a top surface and sidewalls of the central channel region;
   wherein the fin-shaped element is doped with impurities that generate interstitial charged particles configured to move interstitially through a lattice structure of the fin-shaped element under the influence of an electric field applied to the addressable RSD to set a state of the addressable RSD;
   wherein the state of the addressable RSD functions as stored data of the addressable RRAM storage cell; and
   wherein the source region, the drain region, and the central region are doped with the impurities that generate the impurities that generate the interstitial charged particles.

2. The apparatus of claim 1, wherein the impurities are selected from a group consisting of lithium, sodium, and potassium.

3. The apparatus of claim 1, wherein the addressable RSD is configured to generate the electric field based at least in part on a bias applied between the gate and the drain region.

4. The apparatus of claim 1, wherein the addressable RSD is configured to generate the electric field based at least in part on a bias applied between the gate and the source region.

5. The apparatus of claim 1, wherein:
   the addressable RSD functions as both an addressable field effect transistor (FET) and the addressable RSD;
   when the addressable RSD functions as the addressable FET, a threshold voltage of the addressable RSD applied to the gate generates current-flow from the source region through the central channel region to the drain region;
   when the addressable RSD functions as the addressable RSD, interstitially moving the interstitial charged particles through the lattice structure of the fin-shaped element results in the threshold voltage of the addressable RSD changing;
   the threshold voltage of the addressable RSD changing results in a resistance of the addressable RSD changing;
   the state of the addressable RSD comprises the resistance of the addressable RSD; and
   the addressable RSD is further configured to:
      change the state of the addressable RSD based at least in part on an application of the electric field to the addressable RSD; and
      maintain the state of the addressable RSD based at least in part on the electric field not being applied to the addressable RSD.

6. The apparatus of claim 1 further comprising a gate dielectric positioned between the gate and the central channel region, wherein the gate dielectric functions as a barrier to substantially prevent the interstitial charged particles from leaving the fin-shaped element.

7. The apparatus of claim 1, wherein the substrate comprises a bulk semiconductor material.

8. The apparatus of claim 1, wherein:
   the substrate comprises a semiconductor-on-insulator (SOI) material; and
   an insulator region of the SOI material functions as a barrier to substantially prevent the interstitial charged particles from leaving the fin-shaped element.

9. The apparatus of claim 1, wherein:
   the substrate comprises a substrate material selected from a group consisting of silicon, silicon germanium, gallium, and gallium arsenide; and
   the fin-shaped element comprises a fin material selected from a group consisting of silicon, silicon germanium, gallium, and gallium arsenide.

10. A method of forming an apparatus, the method comprising:
    forming an addressable non-volatile memory (NVM) array comprising a plurality of addressable resistive random-access memory (RRAM) storage cells;
    wherein each addressable RRAM storage cell of the plurality of RRAM storage cells comprises an addressable resistive switching device (RSD) comprising:
       a fin-shaped element on a substrate, wherein the fin-shaped element comprises a source region, a central channel region, and a drain region; and
       a gate over a top surface and sidewalls of the central channel region;

wherein the fin-shaped element is doped with impurities that generate interstitial charged particles configured to move interstitially through a lattice structure of the fin-shaped element under the influence of an electric field applied to the addressable RSD to set a state of the addressable RSD;

wherein the state of the addressable RSD functions as stored data of the addressable RRAM storage cell; and wherein the source region, the drain region, and the central region are doped with the impurities that generate the impurities that generate the interstitial charged particles.

11. The method of claim 10, wherein the impurities that generate the interstitial charged particles are selected from a group consisting of lithium, sodium, and potassium.

12. The method of claim 10 further comprising forming a gate dielectric between the gate and the central channel region, wherein the gate dielectric functions as a barrier to substantially prevent the interstitial charged particles from leaving the fin-shaped element.

13. The method of claim 10, wherein the substrate is selected from a group consisting of:
a bulk semiconductor material; and
a semiconductor-on-insulator (SOI) material.

14. The method of claim 10, wherein:
the substrate is selected from a group consisting of silicon, silicon germanium, gallium, and gallium arsenide; and
the fin-shaped element is selected from a group consisting of silicon, silicon germanium, gallium, and gallium arsenide.

* * * * *